US011222933B2

(12) United States Patent
Chang et al.

(10) Patent No.: US 11,222,933 B2
(45) Date of Patent: Jan. 11, 2022

(54) DISPLAY PANEL EQUIPPED WITH FUNCTION OF DETECTING AN OBJECT, AND METHOD FOR DETECTING AN OBJECT ON A DISPLAY PANEL

(71) Applicant: HIMAX TECHNOLOGIES LIMITED, Tainan (TW)

(72) Inventors: Yaw-Guang Chang, Tainan (TW); Jia-Ming He, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/860,085

(22) Filed: Apr. 28, 2020

(65) Prior Publication Data

US 2021/0335897 A1 Oct. 28, 2021

(51) Int. Cl.
| | |
|---|---|
| *H01L 27/32* | (2006.01) |
| *G06K 9/00* | (2006.01) |
| *G02F 1/1333* | (2006.01) |

(52) U.S. Cl.
CPC ........ *H01L 27/323* (2013.01); *G02F 1/13338* (2013.01); *G06K 9/0002* (2013.01); *H01L 27/3227* (2013.01)

(58) Field of Classification Search
None
See application file for complete search history.

(56) References Cited

U.S. PATENT DOCUMENTS

| | | | | |
|---|---|---|---|---|
| 2005/0088380 | A1* | 4/2005 | Bulovic | G06F 3/038 345/77 |
| 2008/0246708 | A1* | 10/2008 | Ishiguro | G02F 1/13318 345/87 |
| 2011/0115767 | A1 | 5/2011 | Senda | |
| 2017/0220838 | A1 | 8/2017 | He | |
| 2017/0337413 | A1* | 11/2017 | Bhat | G06K 9/00087 |
| 2018/0267651 | A1* | 9/2018 | Park | G06F 3/0412 |

FOREIGN PATENT DOCUMENTS

| | | |
|---|---|---|
| CN | 111027516 A | 4/2020 |
| TW | 201737157 A | 10/2017 |
| TW | 201843617 A | 12/2018 |
| TW | 201946038 A | 12/2019 |

\* cited by examiner

*Primary Examiner* — Matthew Yeung
(74) *Attorney, Agent, or Firm* — Winston Hsu (57) ABSTRACT

A display panel equipped with function of detecting an object and an associated method are provided. The display panel includes a first photosensitive circuit, a second photosensitive circuit, a detection circuit, a first switch and a second switch. The first photosensitive circuit and the second photosensitive circuit accumulate first charges and second charges in response to first incident light and second incident light to generate a first signal and a second signal, respectively, wherein the object reflects light emitted from the display panel to generate the second incident light. The detection circuit discharges the first charges for converting the first signal into a reference signal on a first input terminal of the detection circuit, and the second signal is transmitted to a second input terminal of the detection circuit, to make the detection circuit to generate a detection signal indicating a difference between the second signal and the reference signal.

16 Claims, 8 Drawing Sheets

DISPLAY PANEL EQUIPPED WITH FUNCTION OF DETECTING AN OBJECT, AND METHOD FOR DETECTING AN OBJECT ON A DISPLAY PANEL

BACKGROUND OF THE INVENTION

1. Field of the Invention

The present invention is related to fingerprint detection, and more particularly, to a display panel (e.g. a touch screen) equipped with function of detecting an object (e.g. fingers, fingertips, fingerprints, etc.), and a method for detecting an object (e.g. fingers, fingertips, fingerprints, etc.) on the display panel.

2. Description of the Prior Art

Fingerprint recognition application is popular in recent electronic products, wherein a fingerprint recognition integrated circuit (IC) may be adopted for recognizing a specific user. Taking a mobile phone as an example, a predetermined sensing area (e.g. an area below a display panel of the mobile phone) may be configured for fingerprint detection. To make user experience better, circuits related to fingerprint detection may be positioned in the display panel (more particularly, a touch screen) of the mobile phone, where an optical fingerprint detection mechanism may be adopted to implement this configuration.

Figure 1:
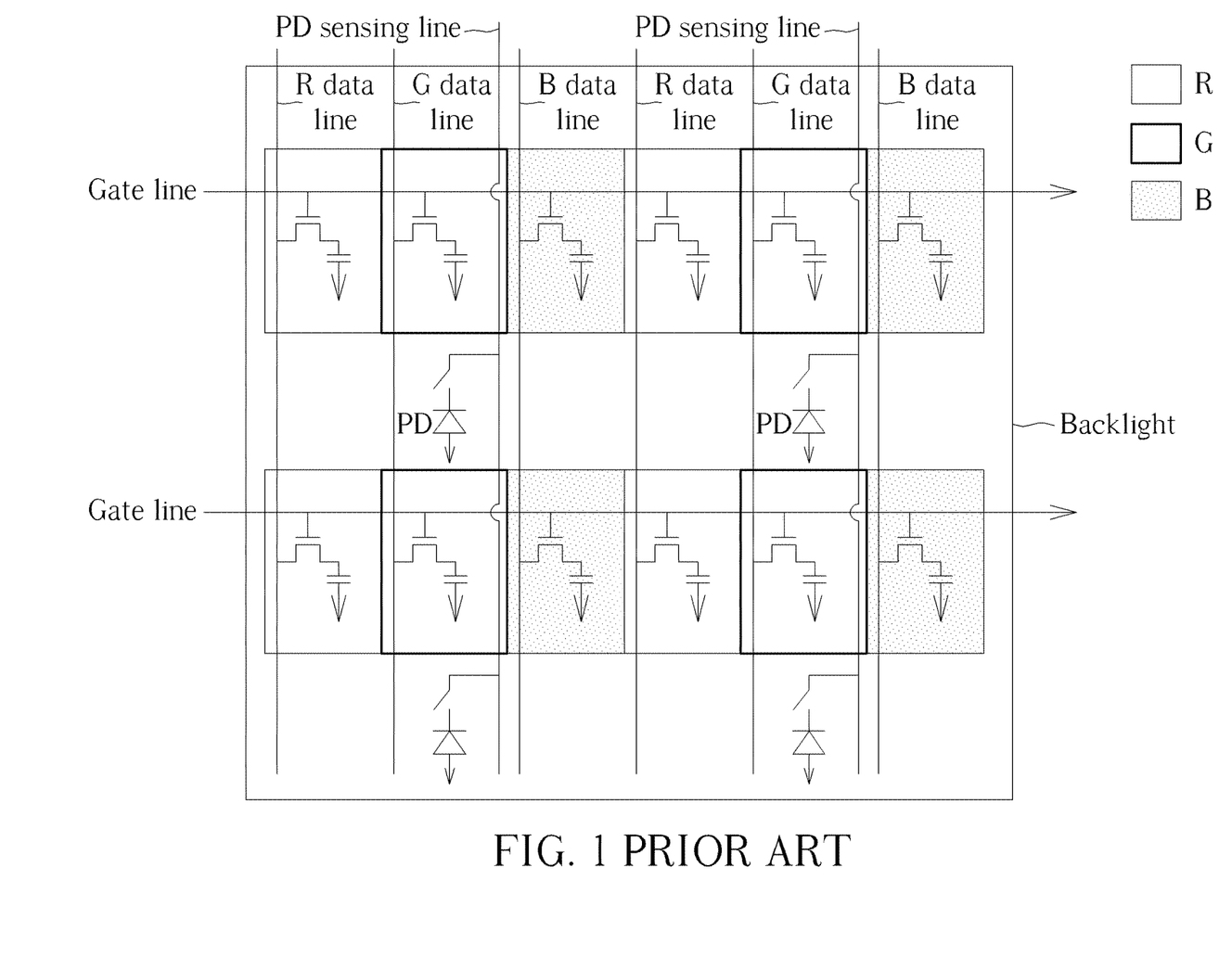
FIG. 1 illustrates an example of a display panel.
Figure 2:
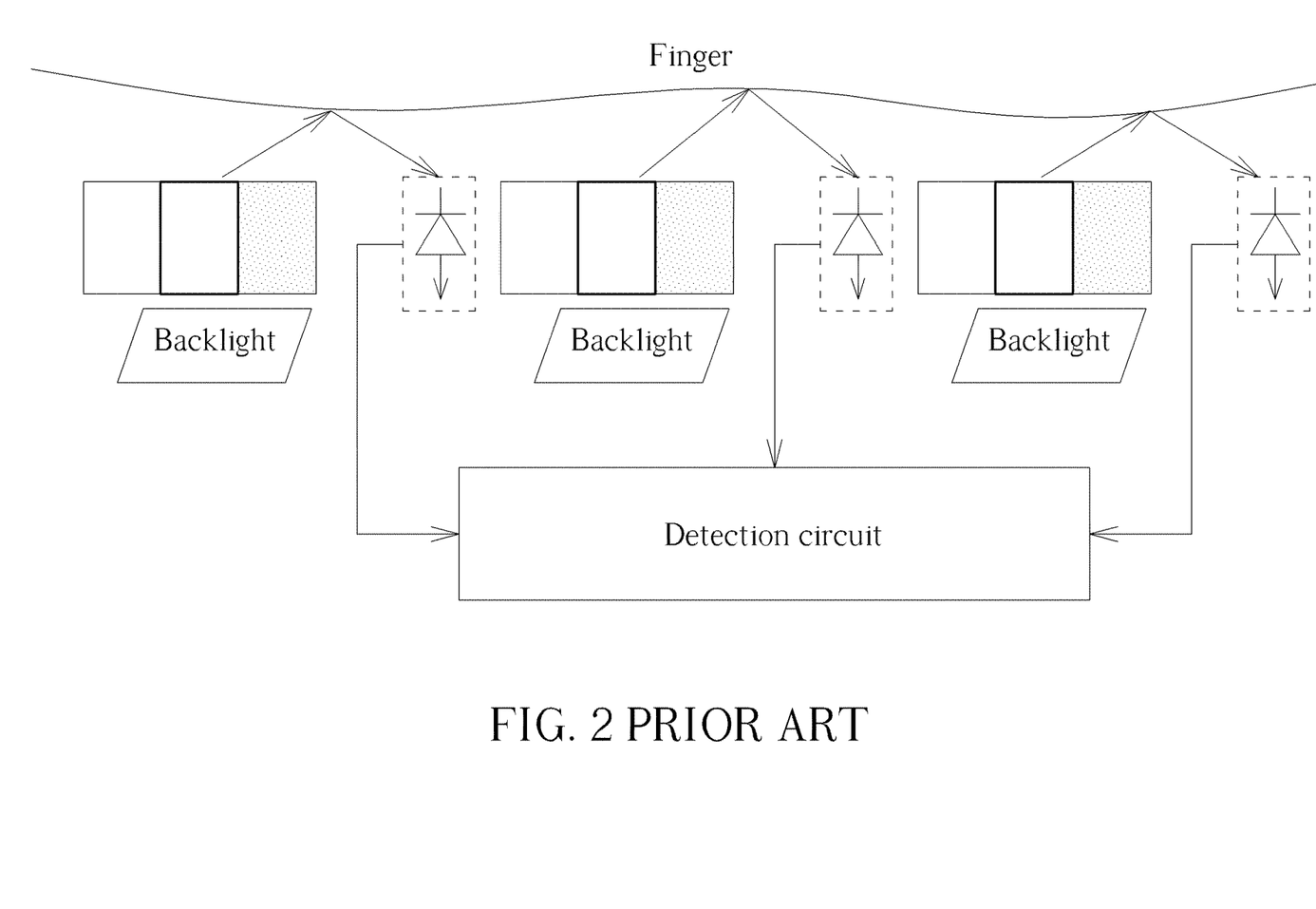
FIG. 2 illustrates an example of fingerprint detection.

FIG. 1 illustrates an example of a display panel. The display panel may comprise a backlight, display units such as red (R), green (G), and blue (B) display units, gate lines, data lines such as R, G, and B data lines, photo detectors, and photo detector sensing lines, where the legend such as R, G, and B may indicate the respective colors of the display units. An example of fingerprint detection may be illustrated as shown in FIG. 2. Respective portions of the backlight may provide light through the R, G, and B display units. The surface of a finger (e.g. fingertip thereof) may reflect a portion of the light, and the photo detectors may receive the reflected light to generate signals. As a result, the detection circuit may detect the signals, for obtaining distribution of the fingerprint.

Figure 3:
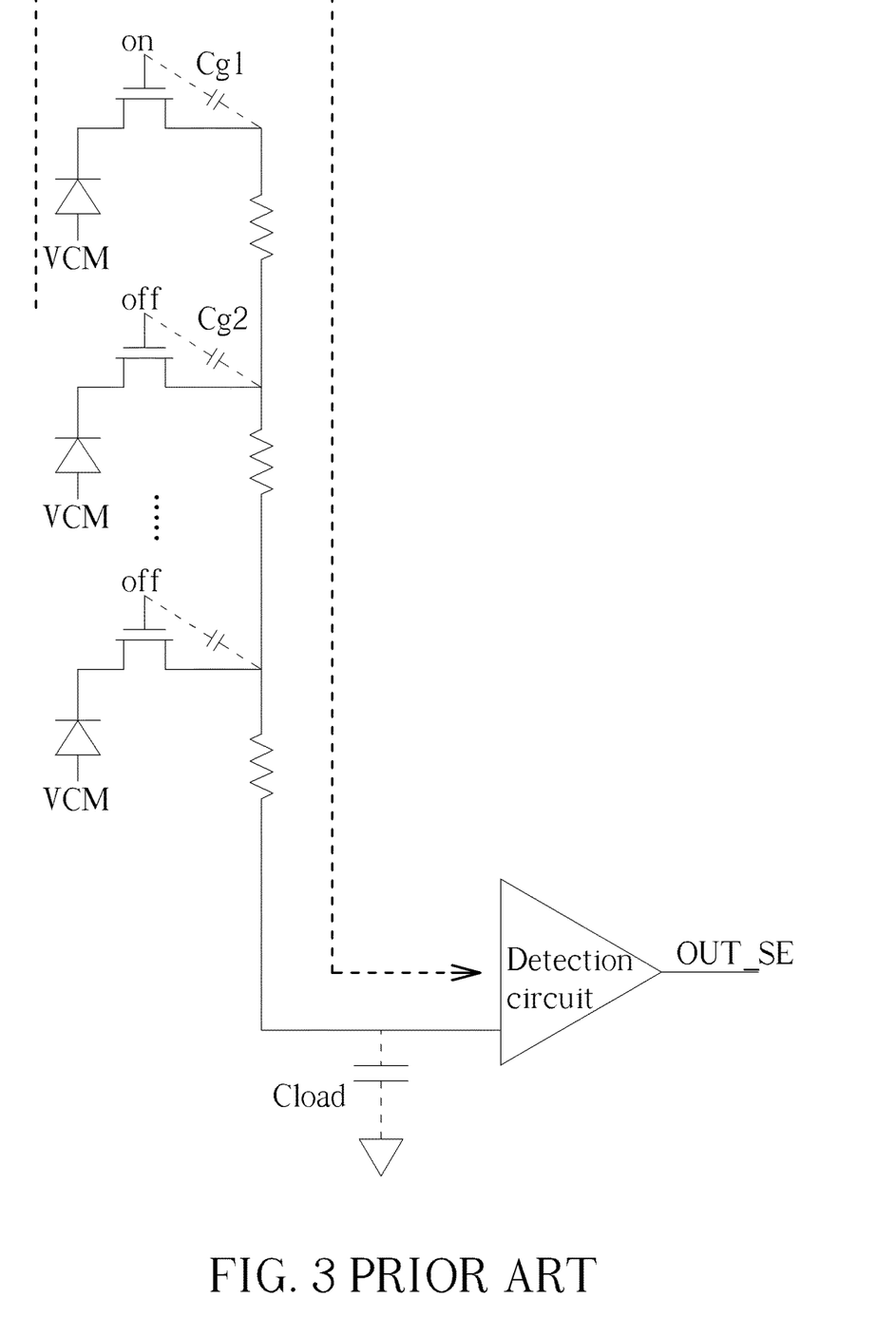
FIG. 3 illustrates an example of an equivalent circuit of a column of photo detectors within an optical fingerprint sensor.

FIG. 3 illustrates an example of an equivalent circuit of a column of photo detectors within an optical fingerprint sensor, where the column of photo detectors may be coupled to a detection circuit. The traces between the optical fingerprint sensor and the detection circuit are quite long, and parasitic capacitance is typically unavoidable. More particularly, the current generated by a photo detector is typically very weak (e.g. 1 pico-ampere (pA)), and there may be various sources of noise, causing difficulty of signal detection. As a result, the output signal OUT_SE of the detection circuit cannot accurately indicate a corresponding portion of a fingerprint.

For example, the noise generated by on/off switching of the switches may pass through the parasitic capacitance such as Cg1, Cg2, etc., and may affect the signal received by the detection circuit. In addition, for normal operations of the photo detector, a bias voltage VCM is typically required, and any jitter of this voltage may also affect the signal received by the detection circuit. Additionally, the parasitic capacitance such as Cload may exist on the traces, and noise may be coupled through it if there is noise at the other side thereof. Thus, a novel architecture is needed for enhancing overall performance.

SUMMARY OF THE INVENTION

An objective of the present invention is to provide a display panel (e.g. a touch screen) equipped with function of detecting an object (e.g. fingers, fingertips, fingerprints, etc.), and a method for detecting an object (e.g. fingers, fingertips, fingerprints, etc.) on the display panel, to implement optical fingerprint detection without introducing any side effect or in a way that is less likely to introduce side effects.

At least one embodiment of the present invention provides a display panel equipped with function of detecting an object. The display panel may comprise a plurality of display units, wherein a predetermined sensing region of the display panel may comprise a plurality of photosensitive circuits. The plurality of photosensitive circuits may comprise a first photosensitive circuit and a second photosensitive circuit, wherein the first photosensitive circuit and the second photosensitive circuit belong to a first display unit and a second display unit among the plurality of display units. The display panel may further comprise a detection circuit, a first switch and a second switch, wherein the first switch is coupled between the first photosensitive circuit and a first input terminal of the detection circuit, and the second switch is coupled between the second photosensitive circuit and a second input terminal of the detection circuit. For example, the first photosensitive circuit may be configured to accumulate first charges in response to first incident light to generate a first signal, and the second photosensitive circuit may be configured to accumulate second charges in response to second incident light to generate a second signal, wherein the object reflects light emitted from the display panel to generate the second incident light. After the first signal and the second signal have been generated, the detection circuit discharges the first charges for converting the first signal into a reference signal on the first input terminal through the first switch, and then the second signal is transmitted to the second input terminal through the second switch, to make the detection circuit to generate a detection signal indicating a difference between the second signal and the reference signal.

At least one embodiment of the present invention provides a method for detecting an object on a display panel. The display panel may comprise a plurality of display units. The method may comprise: utilizing a first photosensitive circuit belonging to a first display unit among the plurality of display units to accumulate first charges in response to first incident light to generate a first signal; utilizing a second photosensitive circuit belonging to a second display unit among the plurality of display units to accumulate second charges in response to second incident light to generate a second signal, wherein the object reflects light emitted from the display panel to generate the second incident light; after the first signal and the second signal have been generated, discharging the first charges to convert the first signal into a reference signal on a first input terminal of a detection circuit of the display panel through a first switch coupled between the first photosensitive circuit and the first input terminal of the detection circuit; transmitting the second signal to a second input terminal of the detection circuit through a second switch coupled between the second photosensitive circuit and the second input terminal of the detection circuit, and utilizing the detection circuit to generate a detection signal indicating a difference between the second signal and the reference signal.

The display panel and the associated method provided by embodiments of the present invention can implement optical fingerprint detection with differential read out architecture, where a reference signal utilized for the differential read out operations can be generated without any additional shielding layer, so the costs for manufacturing the shielding layer can be saved. In comparison with the related art, the noise can be canceled by the differential read out operations, and implementing the embodiments of the present invention will not greatly increase additional costs. Thus, the present invention can enhance the overall performance without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
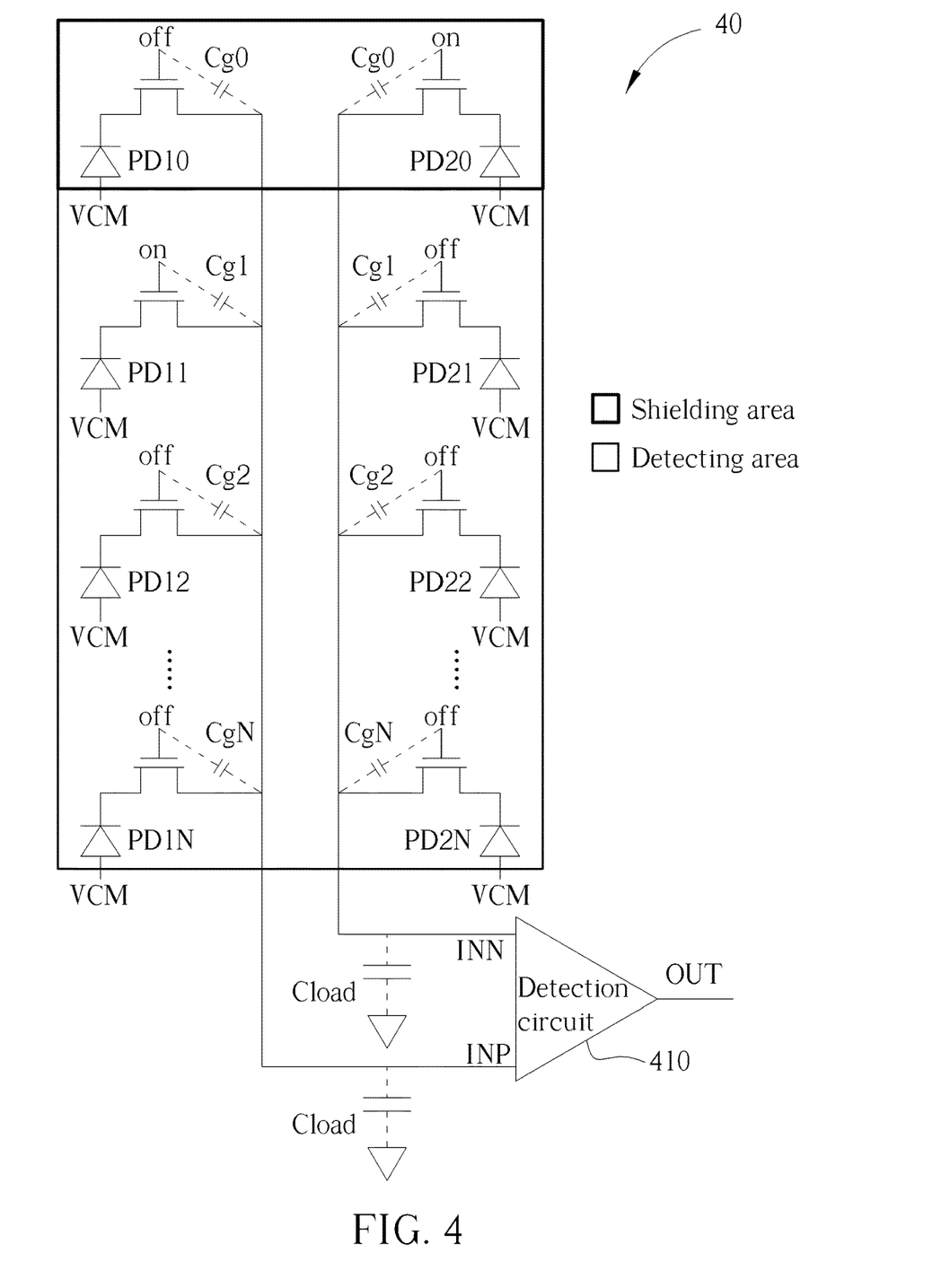
FIG. 4 illustrates circuit implementation of a display panel according to an embodiment of the present invention.

FIG. 4 illustrates circuit implementation of a display panel 40 according to an embodiment of the present invention, where the display panel 40 comprises multiple columns of photo detectors such as a first column of photodiodes {PD10, PD11, PD12, PD13, . . . , PD1N} and a second column of photodiodes {PD20, PD21, PD22, PD23, . . . , PD2N}, and N is a positive integer. The display panel 40 further comprises a detection circuit 410 having a pair of input terminals INP and INN and at least one output terminal such as an output terminal OUT. As shown in FIG. 4, each of the photodiodes {PD10, PD11, PD12, PD13, . . . , PD1N} is controlled by a switch to selectively couple to the input terminal INP of the detection circuit 410, and each of the photodiodes {PD20, PD21, PD22, PD23, . . . , PD2N} is controlled by a switch to selectively couple to the input terminal INN of the detection circuit 410. In this embodiment, some of the first column of photodiodes {PD10, PD11, PD12, PD13, . . . , PD1N} and the second column of photodiodes {PD20, PD21, PD22, PD23, . . . , PD2N}, such as a row of photodiodes, may be included in a shielding area, which is shielded by a shielding layer. For example, the photodiodes PD10 and PD20 are blocked from incident light by the shielding layer. The rest of photodiodes such as {PD11, PD12, PD13, . . . , PD1N} and {PD21, PD22, PD23, . . . , PD2N} are included in a detecting area, which is not shielded by any shielding layer. Although jitter of a bias voltage VCM and parasitic capacitance such as Cload, Cg0, Cg1, Cg2, . . . and CgN may cause noise to be injected into signals transmitted to the detection circuit 410, the detection circuit 410 may output a difference between the signal on the terminal INP and the signal on the input terminal INN to be a detection signal in order to cancel the noise. For example, after a finger reflects light emitted from the display panel 40, the photodiodes {PD11, PD12, PD13, . . . , PD1N} and {PD21, PD22, PD23, . . . , PD2N} in the detecting area may generate charges in response to the reflected light from the finger. When the detection circuit 410 is going to output the detection signal indicating charges generated by the photodiodes PD11, the photodiode PD11 may be coupled to the input terminal INP and the photodiode PD20 may be coupled to the input terminal INN. As the photodiode PD20 is shielded by the shielding layer, a signal from the photodiode PD20 may be regarded as a reference signal, and the detection circuit 410 may output a detection signal corresponding to the charges generated by the photodiode PD11 without being affected by noise.

Figure 5:
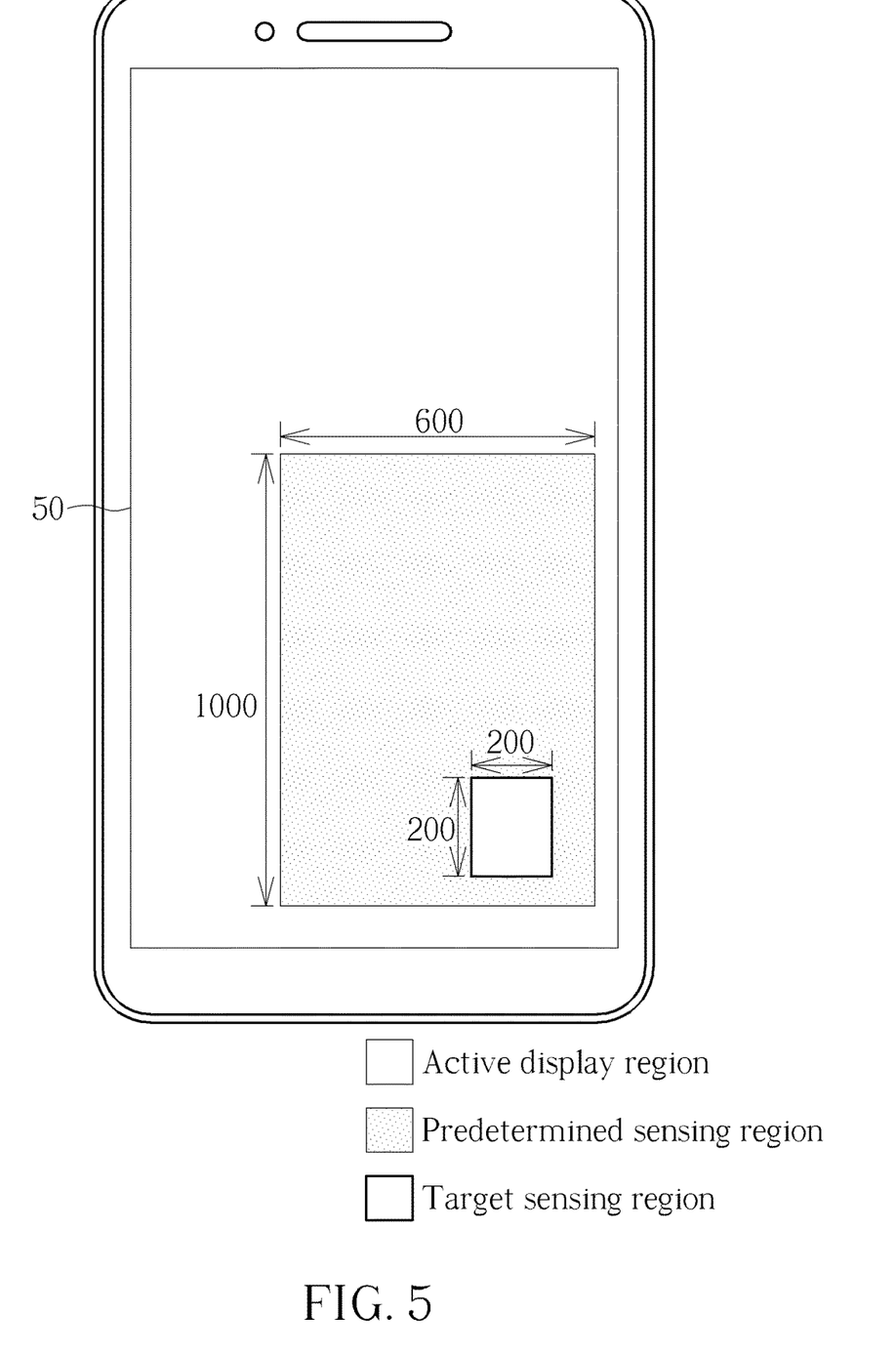
FIG. 5 illustrates a display panel installed in an electronic device according to an embodiment of the present invention.

FIG. 5 illustrates a display panel 50 installed in an electronic device (e.g. a mobile phone) according to an embodiment of the present invention, where the display panel 50 may comprise a plurality of display units. In this embodiment, an active display region may represent a first region (which may be formed by all of the plurality of display units) that is capable of displaying image, and a predetermined sensing region within the active display region may represent a second region (which may be formed by a portion of the display units (e.g. 1000×600) comprising a plurality of photosensitive circuits) that is capable of detecting objects, where a target sensing region may represent a third region (which may be formed by a portion of the display units (e.g. 200×200) comprising a portion of the photosensitive circuits) that is touched by an object such as a finger of a user. It should be noted that the predetermined sensing region is fixed, but the target sensing region may vary when the user put the finger on different positions. The display panel 50 may be a touch screen that is capable of detecting a position of the finger, and the position of the finger in the predetermined sensing region may represent the position of the target sensing region. The implementation of detecting the position of the finger is well known for those skilled in this art, and therefore may be omitted for brevity.

Figure 6:
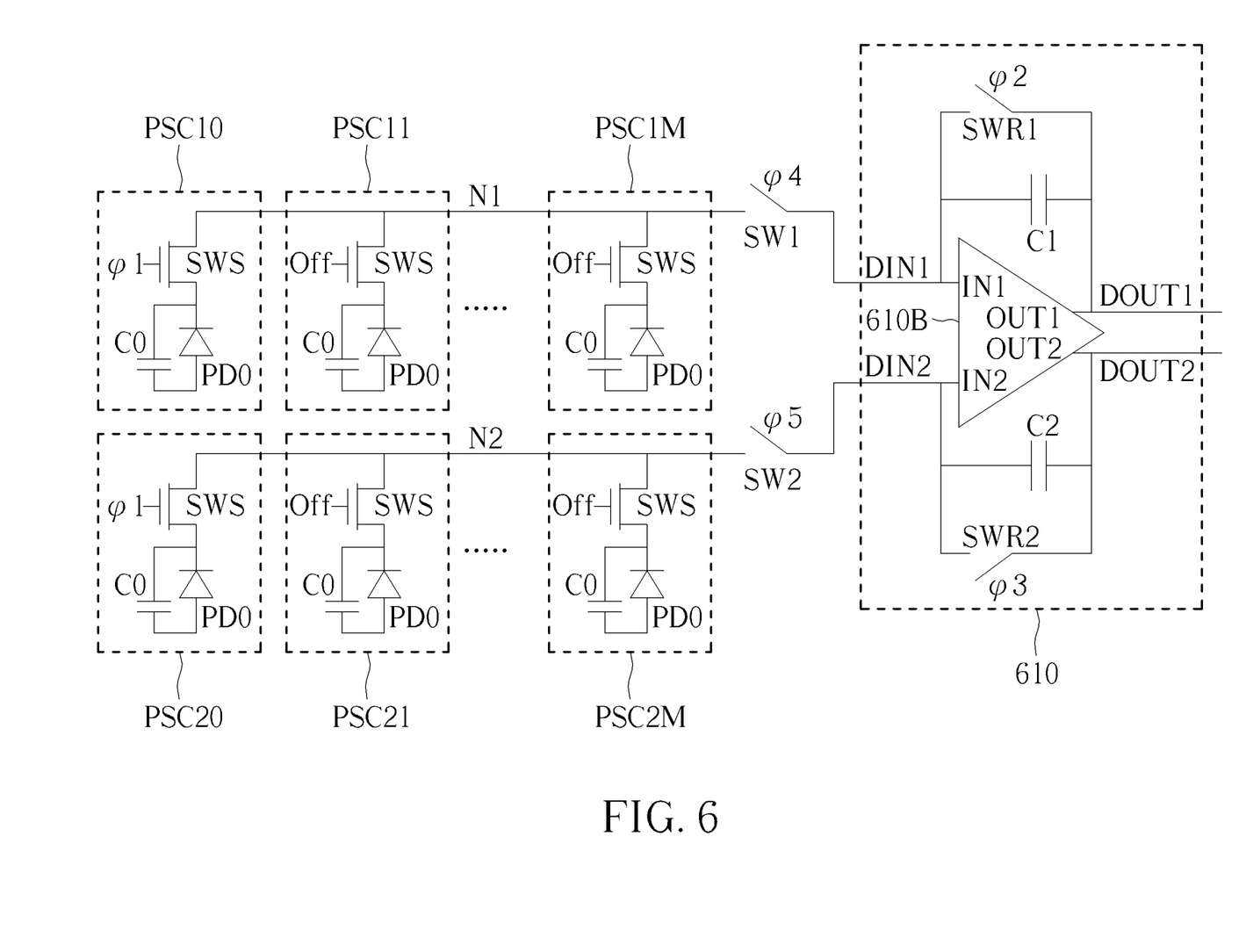
FIG. 6 illustrates some implementation details of the predetermined sensing region of the display panel shown in FIG. 5 according to an embodiment of the present invention.

In order to implement the function of the variable position of the target sensing region illustrated in the embodiment of FIG. 5, the shielding layer utilized in the embodiment of FIG. 4 should be removed. FIG. 6 illustrates some implementation details of the predetermined sensing region of the display panel 50 shown in FIG. 5 according to an embodiment of the present invention. As shown in FIG. 6, the predetermined sensing region may comprise a plurality of photosensitive circuits such as a first set of photosensitive circuits {PSC10, PSC11, . . . , PSC1M} and a second set of photosensitive circuits {PSC20, PSC21, . . . , PSC2M}, where M is a positive integer. For example, the photosensitive circuits PSC10, PSC11, . . . and PSC1M may belong to M display units among a column of display units in the predetermined sensing region, respectively, and the photosensitive circuits PSC20, PSC21, . . . and PSC2M may belong to M display units among another column (e.g. an adjacent column) of display units in the predetermined sensing region, respectively, but the present invention is not limited thereto. Each of the photosensitive circuits PSC10, PSC11, . . . , PSC1M, PSC20, PSC21, . . . and PSC2M may accumulate charges in response to incident light to generate a corresponding signal. As shown in FIG. 6, each of the photosensitive circuits PSC10, PSC11, . . . and PSC1M are coupled to a node N1, and each of the photosensitive circuits PSC20, PSC21, . . . and PSC2M are coupled to a node N2. In this embodiment, the display panel 50 may further comprise a detection circuit 610 and switches SW1 and SW2, where the switch SW1 is coupled between the node N1 and an input terminal DIN1 of the detection circuit 610, and the switch SW2 is coupled between the node N2 and an input terminal DIN2 of the detection circuit 610.

As show in FIG. 6, any photosensitive circuit (e.g. each photosensitive circuit) of the photosensitive circuits PSC10, PSC11, . . . , PSC1M, PSC20, PSC21, . . . and PSC2M may comprise a photodiode PD0, a capacitor C0 and a switch SWS, where the switch SWS may be implement by at least one transistor, but the present invention is not limited thereto. In addition, in this photosensitive circuit, the capacitor C0 may be coupled to the photodiode PD0 (e.g. coupled between a cathode and an anode of the photodiode PD0), and the switch SWS is coupled to the capacitor C0 and the photodiode PD0 (e.g. coupled to the cathode of the photodiode PD0), where the photodiode PD0 may be configured to generate the charges in response to the incident light, the capacitor C0 may be configured to store the charges generated by the photodiode PD0, and the switch SWS may be configured to control timing of outputting the charges from the capacitor C0 to outside of this photosensitive circuit (e.g. outputting the charges to the node N1 or N2).

As shown in FIG. 6, the detection circuit 610 may comprise a buffer circuit 610B (e.g. an amplifier with differential input terminals and differential output terminals), capacitors C1 and C2, and switches SWR1 and SWR2. In this embodiment, input terminals IN1 and IN2 (e.g. the differential input terminals of the amplifier) of the buffer circuit 610B are coupled to the input terminals DIN1 and DIN2 of the detection circuit 610, respectively, and output terminals OUT1 and OUT2 (e.g. the differential output terminals of the amplifier) of the buffer circuit 610B are coupled to output terminals DOUT1 and DOUT2 of the detection circuit 610, respectively, but the present invention is not limited thereto. In this embodiment, the capacitor C1 is coupled between the input terminal IN1 and the output terminal OUT1 of the buffer circuit 610B, and the capacitor C2 is coupled between the input terminal IN2 and the output terminal OUT2 of the buffer circuit 610B. Furthermore, the switch SWR1 is coupled between the input terminal IN1 and the output terminal OUT1 of the buffer circuit 610B, and the switch SWR2 is coupled between the input terminal IN2 and the output terminal OUT2 of the buffer circuit 610B.

When the display panel 50 detects that an object (e.g. a finger of a user) touches the display panel 50, the display panel 50 may emit light in a specific period, and the finger may reflect this light and generate reflected light in response to fingerprint of the finger. It should be noted that only photosensitive circuits positioned in the target sensing region receive the reflected light associated with fingerprint information, and photosensitive circuits positioned outside the target sensing region may receive unwanted light from any other light source (e.g. environment light) that is not associated with the fingerprint information since there is no shielding layer for blocking the unwanted light. With aid of timing control of the switches SWS, the switches SW1/SW2 and the switches SWR1/SWR2, the display panel 50 may convert a signal generated based on the unwanted light into a reference signal (which has an initial voltage level without exposure), and thereby achieve a similar effect that the shielding layer can achieve.

For better comprehension, assume that the photosensitive circuit PSC10 is positioned outside the target sensing region and the photosensitive circuit PSC20 is positioned inside the target sensing region. The photosensitive circuit PSC10 may accumulate first charges in response to first incident light (e.g. the unwanted light such as the environment light) to generate a first signal, and the photosensitive circuit PCS20 may accumulate second charges in response to second incident light to generate a second signal, where the finger (e.g. the fingerprint) reflects light emitted from the display panel 50 to generate the second incident light. During a phase of reading out the second signal which carries information related to the fingerprint, the switches SWS of the photosensitive circuits PSC10 and PSC20 are controlled by signals $\varphi 1$, and the switches SWS of the rest photosensitive circuits PSC11, . . . , PSC1M, PSC21, . . . and PSC2M are turned off as show in FIG. 6; furthermore, the switches SWR1, SWR2, SW1 and SW2 are controlled by signals $\varphi 2$, $\varphi 4$ and $\varphi 5$, respectively.

Figure 7:
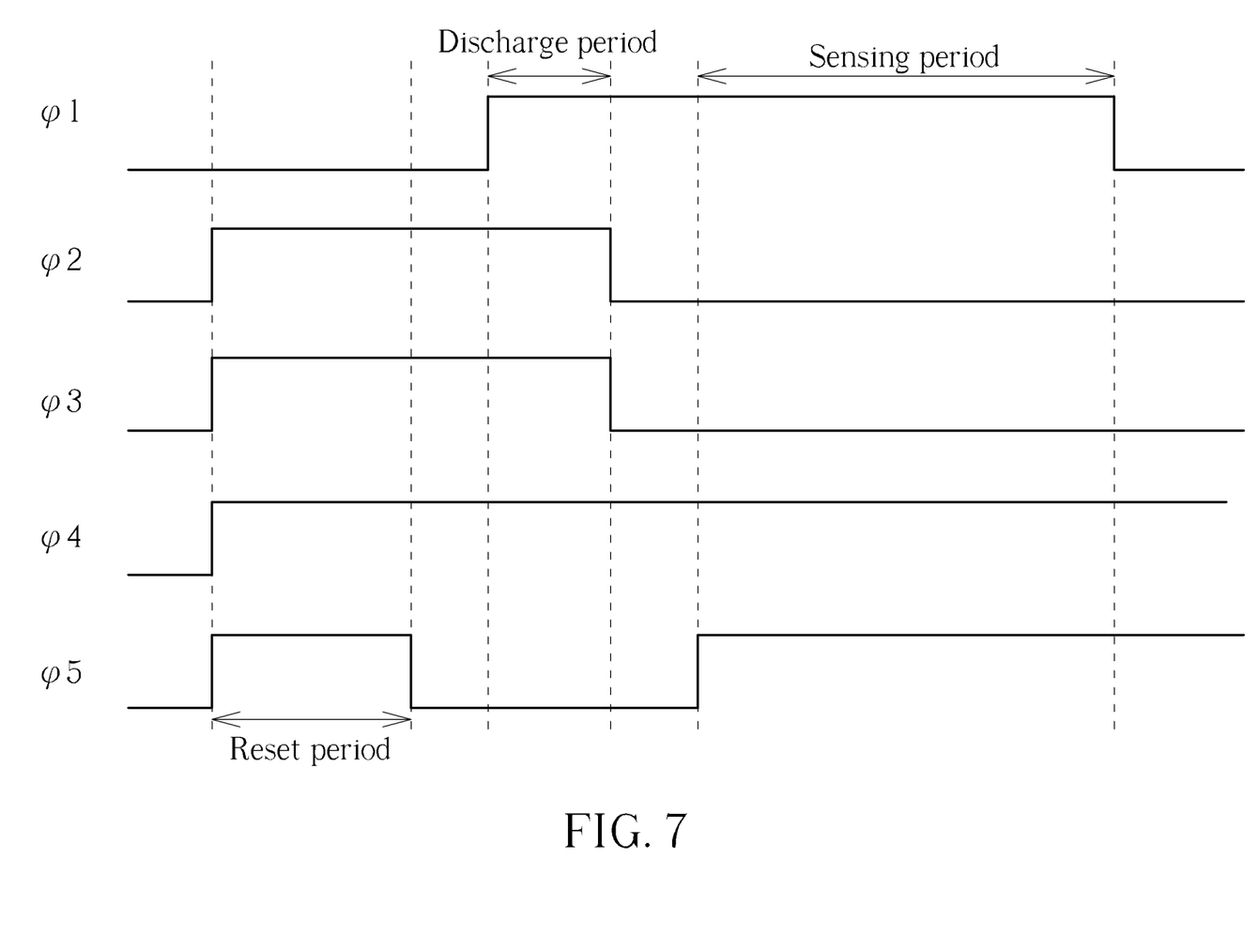
FIG. 7 is a timing diagram illustrating some signals show in FIG. 6 according to an embodiment of the present invention.

FIG. 7 is a timing diagram illustrating the signals $\varphi 1$, $\varphi 2$, $\varphi 4$ and $\varphi 5$ according to an embodiment of the present invention, where the signals $\varphi 1$, $\varphi 2$, $\varphi 4$ and $\varphi 5$ may be generated by a timing control circuit (not shown) built in the display panel 50, but the present invention is not limited thereto. For better comprehension, please refer to FIG. 7 in conjunction with FIG. 6. During a reset period, as the signal $\varphi 1$ is low (e.g. at a logic level "0") and the signals $\varphi 2$, $\varphi 4$ and $\varphi 5$ are high (e.g. at a logic level "1"), the switches SWS of the photosensitive circuits PSC10/PSC20 are turned off and the switches SWR1, SWR2, SW1 and SW2 are turned on, in order to reset voltage levels on the nodes N1 and N2 to a reference level (e.g. the initial level without exposure). During a discharge period, as the signal $\varphi 5$ is low (e.g. at the logic level "0") and the signals $\varphi 1$, $\varphi 2$, $\varphi 3$ and $\varphi 4$ are high (e.g. at the logic level "1"), the switches SW2 are turned off and the switches of the photosensitive circuits PSC10/PSC20, the switches SWR1, SWR2 and SW1 are turned on, in order to discharge the first charges for converting the first signal into the reference signal on the input terminal DIN1 of the detection circuit 610. During a sensing period, as the signals $\varphi 2$ and $\varphi 3$ are low (e.g. at the logic level "0") and the signals $\varphi 1$, $\varphi 4$ and $\varphi 5$ are high (e.g. at the logic level "1"), the switches SWR1 and SWR2 are turned off and the switches SWS of photosensitive circuits PSC10/PSC20 and the switches SW1 and SW2 are turned on, in order to transmit the second signal to the input terminal DIN2 to make the detection circuit 610 to generate a detection signal indicating a difference between the second signal and the reference signal.

It should be noted that the target sensing region may be different if the user puts the finger thereof on different positions, and it is not limited to utilize a specific photosensitive circuit for generating the first signal which is going to be converted into the reference signal. For example, any photosensitive circuit of the photosensitive circuits PSC10, PSC11, . . . , PSC1M (e.g. a photosensitive circuit PSC1x, where x is an integer within an interval [0, M]) that is positioned outside the target sensing region may be utilized for generating the first signal which is going to be converted into the reference signal, to make the detection circuit 610 to output the detection signal regarding any photosensitive circuit of the photosensitive circuits PSC20, PSC21, . . . , PSC2M (e.g. a photosensitive circuit PSC2y, where y is an integer within an interval [0, M]) that is positioned in the target sensing region. In another example, any photosensitive circuit of the photosensitive circuits PSC20, PSC21, . . . , PSC2M (e.g. the photosensitive circuit PSC2y) that is positioned outside the target sensing region may be utilized for generating the first signal which is going to be converted into the reference signal, to make the detection circuit 610 to output the detection signal regarding any photosensitive circuit of the photosensitive circuits PSC10, PSC11, . . . , PSC1M (e.g. the photosensitive circuit PSC1*x*) that is positioned in the target sensing region.

In some embodiments, the display panel 50 shown in FIG. 5 may be a liquid crystal display (LCD) panel, and the object (e.g. the finger) may reflect light emitted from a backlight source of the LCD panel through one or more of the display units of the LCD panel to generate the second incident light, but the present invention is not limited thereto. In other embodiments, the display panel 50 shown in FIG. 5 may be an organic light-emitting diode (OLED) panel or a Micro OLED panel, and the object (e.g. the finger) may reflect light emitted from at least one OLED of the OLED panel or the Micro OLED panel to generate the second incident light, but the present invention is not limited thereto.

Under the operations illustrated in the embodiments of FIG. 5-7, the display panel 50 can have the advantage of noise cancellation with aid of differential read out operations similar to that of the embodiment of FIG. 4. Furthermore, the shielding layer utilized in the embodiment of FIG. 4 is not required in the display panel 50, thereby enhancing the overall performance without greatly increase costs.

Figure 8:
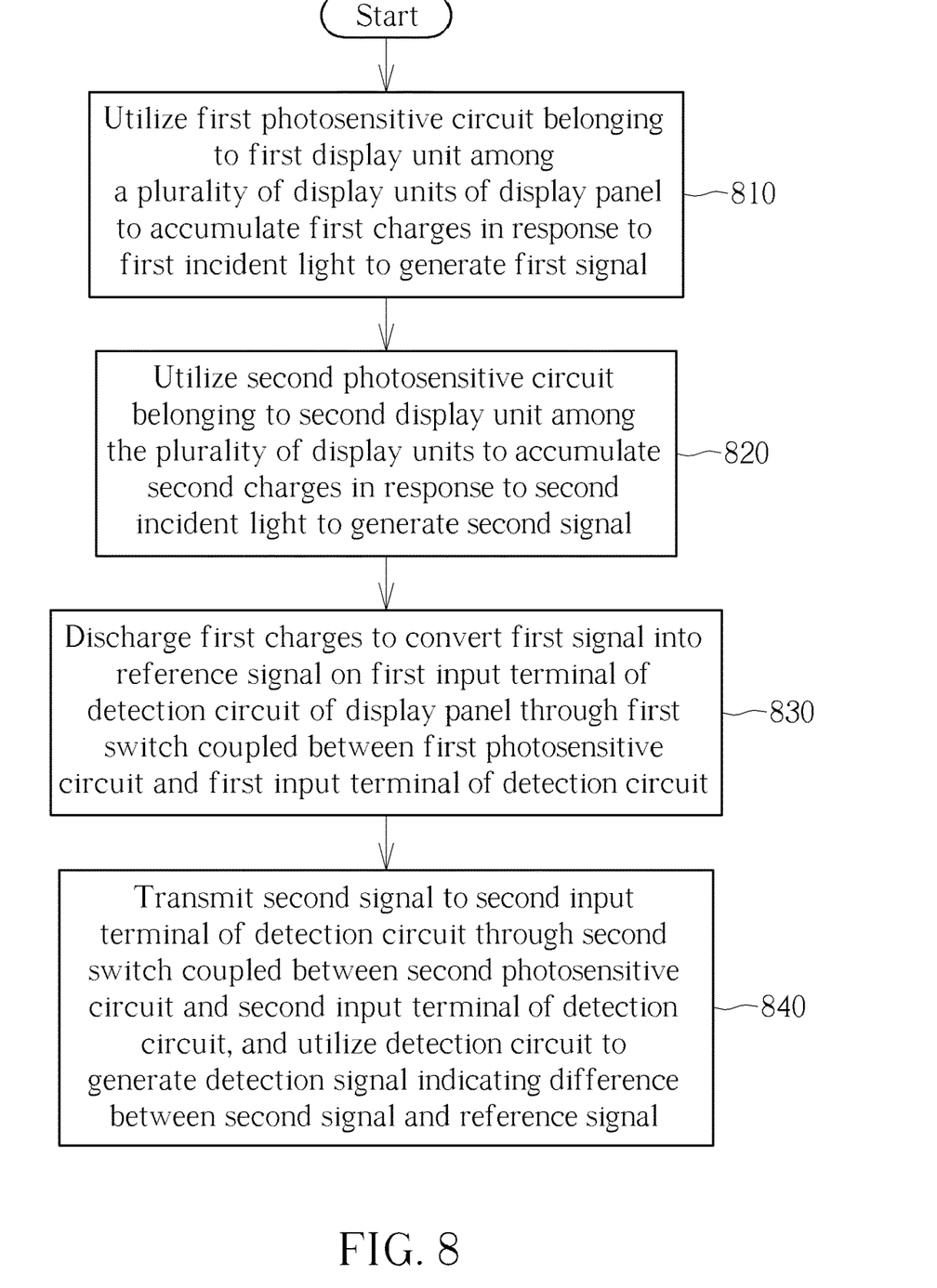
FIG. 8 is a working flow illustrating a method for detecting an object on a display panel according to an embodiment of the present invention.

FIG. 8 is a working flow illustrating a method for detecting an object such as a finger (e.g. fingerprint thereon) on a display panel such as the display panel 50 according to an embodiment of the present invention. It should be noted that the working flow shown in FIG. 8 is for illustrative purposes only, but is not a limitation of the present invention. One or more steps may be added, deleted or modified in the working flow shown in FIG. 8. In addition, if a same result may be obtained, these steps do not have to be executed in the exact order shown in FIG. 8.

In Step 810, the display panel 50 may utilize a first photosensitive circuit belonging to a first display unit among a plurality of display units of the display panel 50 to accumulate first charges in response to first incident light to generate a first signal.

In Step 820, the display panel 50 may utilize a second photosensitive circuit belonging to a second display unit among the plurality of display units to accumulate second charges in response to second incident light to generate a second signal, where the object reflects light emitted from the display panel 50 to generate the second incident light.

In Step 830, the display panel 50 may discharge the first charges to convert the first signal into a reference signal on a first input terminal of a detection circuit (e.g. the detection circuit 610 shown in FIG. 6) of the display panel 50 through a first switch coupled between the first photosensitive circuit and the first input terminal of the detection circuit.

In Step 840, the display panel 50 may transmit the second signal to a second input terminal of the detection circuit through a second switch coupled between the second photosensitive circuit and the second input terminal of the detection circuit, and utilize the detection circuit to generate a detection signal indicating a difference between the second signal and the reference signal.

The display panel and the associated method provided by the embodiments of the present invention can allow the fingerprint information to be read out via a differential architecture without using any shielding layer for generating the reference signal. In comparison with the related art, the present invention can enhance the overall performance of fingerprint detection without introducing any side effects or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display panel equipped with function of detecting an object, comprising:
   a plurality of display units, wherein a predetermined sensing region of the display panel comprises a plurality of photosensitive circuits, and the plurality of photosensitive circuits comprises:
      a first photosensitive circuit, belonging to a first display unit among the plurality of display units, configured to accumulate first charges in response to first incident light to generate a first signal; and
      a second photosensitive circuit, belonging to a second display unit among the plurality of display units, configured to accumulate second charges in response to second incident light to generate a second signal, wherein the object reflects light emitted from the display panel to generate the second incident light;
   a detection circuit, having a first input terminal and a second input terminal, wherein the detection circuit comprises:
      a buffer circuit, wherein the first input terminal and the second input terminal of the detection circuit are coupled to differential input terminals of the buffer circuit;
      a first reset switch, coupled between a first output terminal of the buffer circuit and the first input terminal of the detection circuit; and
      a second reset switch, coupled between a second output terminal of the buffer circuit and the second input terminal of the detection circuit;
   a first switch, coupled between the first photosensitive circuit and the first input terminal of the detection circuit; and
   a second switch, coupled between the second photosensitive circuit and the second input terminal of the detection circuit;
   wherein after the first signal and the second signal have been generated, the detection circuit discharges the first charges for converting the first signal into a reference signal on the first input terminal through the first switch, and then the second signal is transmitted to the second input terminal through the second switch, to make the detection circuit to generate a detection signal indicating a difference between the second signal and the reference signal.

2. The display panel of claim 1, wherein the display panel is a liquid crystal display (LCD) panel, and the object reflects light emitted from a backlight source of the LCD panel through one or more of the display units of the LCD panel to generate the second incident light.

3. The display panel of claim 1, wherein the display panel is an organic light-emitting diode (OLED) panel or a Micro OLED panel, and the object reflects light emitted from at least one OLED of the OLED panel or the Micro OLED panel to generate the second incident light.

4. The display panel of claim 1, wherein the second photosensitive circuit is positioned in a target sensing region touched by the object in the predetermined sensing region.

5. The display panel of claim 4, wherein the first photosensitive circuit is positioned outside the target sensing region.

6. The display panel of claim 1, wherein the first switch, the first reset switch and the second reset switch are turned on and the second switch is turned off, in order to discharge the first charges for converting the first signal into the reference signal.

7. The display panel of claim 1, wherein the first switch and the second switch are turned on and the first reset switch and the second reset switch are turned off, in order to transmit the second signal to the second input terminal of the detection circuit for generating the detection signal on the first output terminal and the second output terminal.

8. The display panel of claim 1, wherein each of the first photosensitive circuit and the second photosensitive circuit comprises:
- a photodiode, configured to generate charges in response to incident light;
- a capacitor, coupled to the photodiode, configured to store the charges generated by the photodiode; and
- a selecting switch, coupled to the capacitor and the photodiode, configured to control timing of outputting the charges from the capacitor to outside of said each of the first photosensitive circuit and the second photosensitive circuit.

9. A method for detecting an object on a display panel, the display panel comprising a plurality of display units, the method comprising:
- utilizing a first photosensitive circuit belonging to a first display unit among the plurality of display units to accumulate first charges in response to first incident light to generate a first signal;
- utilizing a second photosensitive circuit belonging to a second display unit among the plurality of display units to accumulate second charges in response to second incident light to generate a second signal, wherein the object reflects light emitted from the display panel to generate the second incident light;
- after the first signal and the second signal have been generated, discharging the first charges to convert the first signal into a reference signal on a first input terminal of a detection circuit of the display panel through a first switch coupled between the first photosensitive circuit and the first input terminal of the detection circuit; and
- transmitting the second signal to a second input terminal of the detection circuit through a second switch coupled between the second photosensitive circuit and the second input terminal of the detection circuit, and utilizing the detection circuit to generate a detection signal indicating a difference between the second signal and the reference signal;
- wherein the detection circuit comprises:
  - a buffer circuit, wherein the first input terminal and the second input terminal of the detection circuit are coupled to differential input terminals of the buffer circuit;
  - a first reset switch, coupled between a first output terminal of the buffer circuit and the first input terminal of the detection circuit; and
  - a second reset switch, coupled between a second output terminal of the buffer circuit and the second input terminal of the detection circuit.

10. The method of claim 9, wherein the display panel is a liquid crystal display (LCD) panel, and the object reflects light emitted from a backlight source of the LCD panel through one or more of the display units of the LCD panel to generate the second incident light.

11. The method of claim 9, wherein the display panel is an organic light-emitting diode (OLED) panel or a Micro OLED panel, and the object reflects light emitted from at least one OLED of the OLED panel or the Micro OLED panel to generate the second incident light.

12. The method of claim 9, wherein a predetermined sensing region of the display panel comprises a plurality of photosensitive circuits, the photosensitive circuits comprises the first photosensitive circuit and the second photosensitive circuit, and the second photosensitive circuit is positioned in a target sensing region touched by the object in the predetermined sensing region.

13. The method of claim 12, wherein the first photosensitive circuit is positioned outside the target sensing region.

14. The method of claim 9, wherein the step of discharging the first charges to convert the first signal into the reference signal on the first input terminal of the detection circuit of the display panel comprises:
- turning on the first switch, the first reset switch and the second reset switch, and turning off the second switch, in order to discharge the first charges for converting the first signal into the reference signal.

15. The method of claim 9, wherein the step of transmitting the second signal to the second input terminal of the detection circuit and utilizing the detection circuit to generate the detection signal indicating the difference between the second signal and the reference signal comprises:
- turning on the first switch and the second switch, and turning off the first reset switch and the second reset switch, in order to transmit the second signal to the second input terminal of the detection circuit and generate the detection signal on the first output terminal and the second output terminal.

16. The method of claim 9, wherein each of the first photosensitive circuit and the second photosensitive circuit comprises:
- a photodiode, configured to generate charges in response to incident light;
- a capacitor, coupled to the photodiode, configured to store the charges generated by the photodiode; and
- a selecting switch, coupled to the capacitor and the photodiode, configured to control outputting the charges from the capacitor to outside of said each of the first photosensitive circuit and the second photosensitive circuit.

* * * * *